(12) United States Patent
Liu et al.

(10) Patent No.: US 11,257,964 B2
(45) Date of Patent: Feb. 22, 2022

(54) SENSOR PACKAGE STRUCTURE (71) Applicant: KINGPAK TECHNOLOGY INC., Hsin-Chu County (TW)

(72) Inventors: Fu-Chou Liu, Hsin-Chu County (TW); Chien-Chen Lee, Hsin-Chu County (TW); Li-Chun Hung, Hsin-Chu County (TW); Ya-Han Chang, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 59 days.

(21) Appl. No.: 16/910,399

(22) Filed: Jun. 24, 2020

(65) Prior Publication Data
US 2021/0288190 A1 Sep. 16, 2021

(30) Foreign Application Priority Data
Mar. 10, 2020 (TW) ................... 109107862

(51) Int. Cl.
| | | |
|---|---|---|
| *H01L 27/146* | (2006.01) | |
| *H01L 31/0224* | (2006.01) | |
| *H01L 23/538* | (2006.01) | |
| *H01L 31/02* | (2006.01) | |
| *H01L 25/04* | (2014.01) | |

(52) U.S. Cl.
CPC ...... *H01L 31/0224* (2013.01); *H01L 23/5385* (2013.01); *H01L 23/5386* (2013.01); *H01L 25/041* (2013.01); *H01L 31/02016* (2013.01)

(58) Field of Classification Search
CPC ............. H01L 31/0224; H01L 23/5386; H01L 31/02016; H01L 23/5385; H01L 25/041
See application file for complete search history.

(56) References Cited

U.S. PATENT DOCUMENTS

| | | | | |
|---|---|---|---|---|
| 6,492,699 B1* | 12/2002 | Glenn | ............... | H01L 27/14618 257/433 |
| 10,700,111 B2* | 6/2020 | Hung | ................ | H01L 27/14634 |
| 10,868,062 B2* | 12/2020 | Lee | .................... | H01L 27/14623 |
| 10,964,615 B2* | 3/2021 | Hung | ................ | H01L 31/02325 |
| 11,133,348 B2* | 9/2021 | Hung | ..................... | H01L 24/26 |
| 2004/0065952 A1* | 4/2004 | Prior | ................. | H01L 27/14625 257/724 |
| 2008/0105941 A1* | 5/2008 | Chang | ............... | H01L 27/14618 257/433 |

(Continued)

*Primary Examiner* — Bitew A Dinke
(74) *Attorney, Agent, or Firm* — Li & Cai Intellectual Property (USA) Office (57) ABSTRACT

A sensor package structure includes a substrate, a sensor chip disposed on and electrically coupled to the substrate, an opaque support (e.g., a ring-shaped solder mask) disposed on the sensor chip, and a light permeable layer disposed on the opaque support. The sensor chip includes a sensing region. The opaque support surrounds the sensing region, and inner lateral sides of the opaque support form a light-scattering loop wall. The light permeable layer, the light-scattering loop wall of the opaque support, and the sensor chip jointly define an enclosed space therein. When light passes through the light permeable layer and impinges onto the light-scattering loop wall at an incident angle, the light-scattering loop wall scatters the light into multiple rays at angles different from the incident angle.

9 Claims, 5 Drawing Sheets

FIG. 4

(56) References Cited

U.S. PATENT DOCUMENTS

| | | | |
|---|---|---|---|
| 2008/0296718 A1* | 12/2008 | Kumata | H01L 27/14618 |
| | | | 257/434 |
| 2008/0303939 A1* | 12/2008 | Hsu | H01L 27/14618 |
| | | | 348/374 |
| 2009/0046183 A1* | 2/2009 | Nishida | H01L 27/14618 |
| | | | 348/294 |
| 2009/0166784 A1* | 7/2009 | Honda | H01L 31/0203 |
| | | | 257/432 |
| 2009/0256222 A1* | 10/2009 | Hsu | H01L 27/14618 |
| | | | 257/432 |
| 2009/0267170 A1* | 10/2009 | Chien | H01L 27/14683 |
| | | | 257/434 |
| 2010/0244171 A1* | 9/2010 | Nagamatsu | H01L 27/14623 |
| | | | 257/433 |
| 2012/0168888 A1* | 7/2012 | Luan | H01L 27/14618 |
| | | | 257/432 |
| 2013/0149805 A1* | 6/2013 | Chuang | H01L 31/18 |
| | | | 438/65 |
| 2015/0011038 A1* | 1/2015 | Huang | H01L 27/14618 |
| | | | 438/66 |
| 2016/0005778 A1* | 1/2016 | Jun | H01L 27/14618 |
| | | | 257/432 |
| 2016/0148879 A1* | 5/2016 | Saxod | H01L 24/32 |
| | | | 257/684 |
| 2016/0241749 A1* | 8/2016 | Alasimio | H04N 5/2252 |
| 2017/0345864 A1* | 11/2017 | Kinsman | H01L 27/14634 |
| 2018/0012919 A1* | 1/2018 | Tu | H01L 27/14618 |
| 2021/0057470 A1* | 2/2021 | Hung | H01L 27/14636 |
| 2021/0193483 A1* | 6/2021 | Shim | H01L 23/31 |
| 2021/0305437 A1* | 9/2021 | Liu | H01L 31/02002 |

* cited by examiner

SENSOR PACKAGE STRUCTURE

CROSS-REFERENCE TO RELATED PATENT APPLICATION

This application claims the benefit of priority to Taiwan Patent Application No. 109107862, filed on Mar. 10, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

In a conventional sensor package structure, a glass board is arranged above a sensor chip through a glue layer that surrounds a sensing region of the sensor chip. However, light passing through the glass board may be partially reflected by the glue layer to affect the sensing region of the sensor chip (e.g., to generate a glare phenomenon).

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a ring-shaped solder mask, and a light permeable layer. The substrate has a first board surface and a second board surface that is opposite to the first board surface. The sensor chip is disposed on the first board surface of the substrate and is electrically coupled to the substrate. The top surface of the sensor chip has a sensing region. The ring-shaped solder mask is disposed on the top surface of the sensor chip and surrounds the sensing region. Inner lateral sides of the ring-shaped solder mask form a light-scattering loop wall. The light permeable layer has a first surface and a second surface that is opposite to the first surface and that is disposed on the ring-shaped solder mask. The sensor chip, the second surface of the light permeable layer, and the light-scattering loop wall of the ring-shaped solder mask jointly define an enclosed space. When light passes through the light permeable layer and then impinges onto the light-scattering loop wall at an incident angle, the light-scattering loop wall scatters the light into multiple rays at angles different from the incident angle.

In one aspect, the present disclosure provides a sensor package structure, which includes a substrate, a sensor chip, an opaque support, and a light permeable layer. The substrate has a first board surface and a second board surface that is opposite to the first board surface. The sensor chip is disposed on the first board surface of the substrate and is electrically coupled to the substrate. A top surface of the sensor chip has a sensing region. The opaque support is disposed on the top surface of the sensor chip and surrounds the sensing region. Inner lateral sides of the opaque support form a light-scattering loop wall. The light permeable layer has a first surface and a second surface that is opposite to the first surface and that is disposed on the opaque support. The sensor chip, the second surface of the light permeable layer, and the light-scattering loop wall of the opaque support jointly define an enclosed space. When light passes through the light permeable layer and then impinges onto the light-scattering loop wall at an incident angle by passing through the light permeable layer, the light-scattering loop wall scatters the light into multiple rays at angles different from the incident angle.

Therefore, the sensor package structure of the present disclosure is provided with the light-scattering loop wall formed by inner lateral sides of the opaque support (or the ring-shaped solder mask), so that the light passing through the light permeable and impinging onto the light-scattering loop wall layer can be scattered into multiple rays at angles different from the incident angle, effectively reducing the occurrence of the glare phenomenon in the sensor package structure.

Specifically, the opaque support of the present disclosure is implemented with a ring-shaped solder mask. Because the ring-shaped solder mask can be formed by punching, lithography, printing, or coating, the thickness of the ring-shaped solder mask can be effectively and precisely controlled, and the shape of the ring-shaped solder mask (e.g., the shape of the light-scattering loop wall) can be precisely formed. Accordingly, the occurrence of the glare phenomenon in the sensor package structure of the present disclosure can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
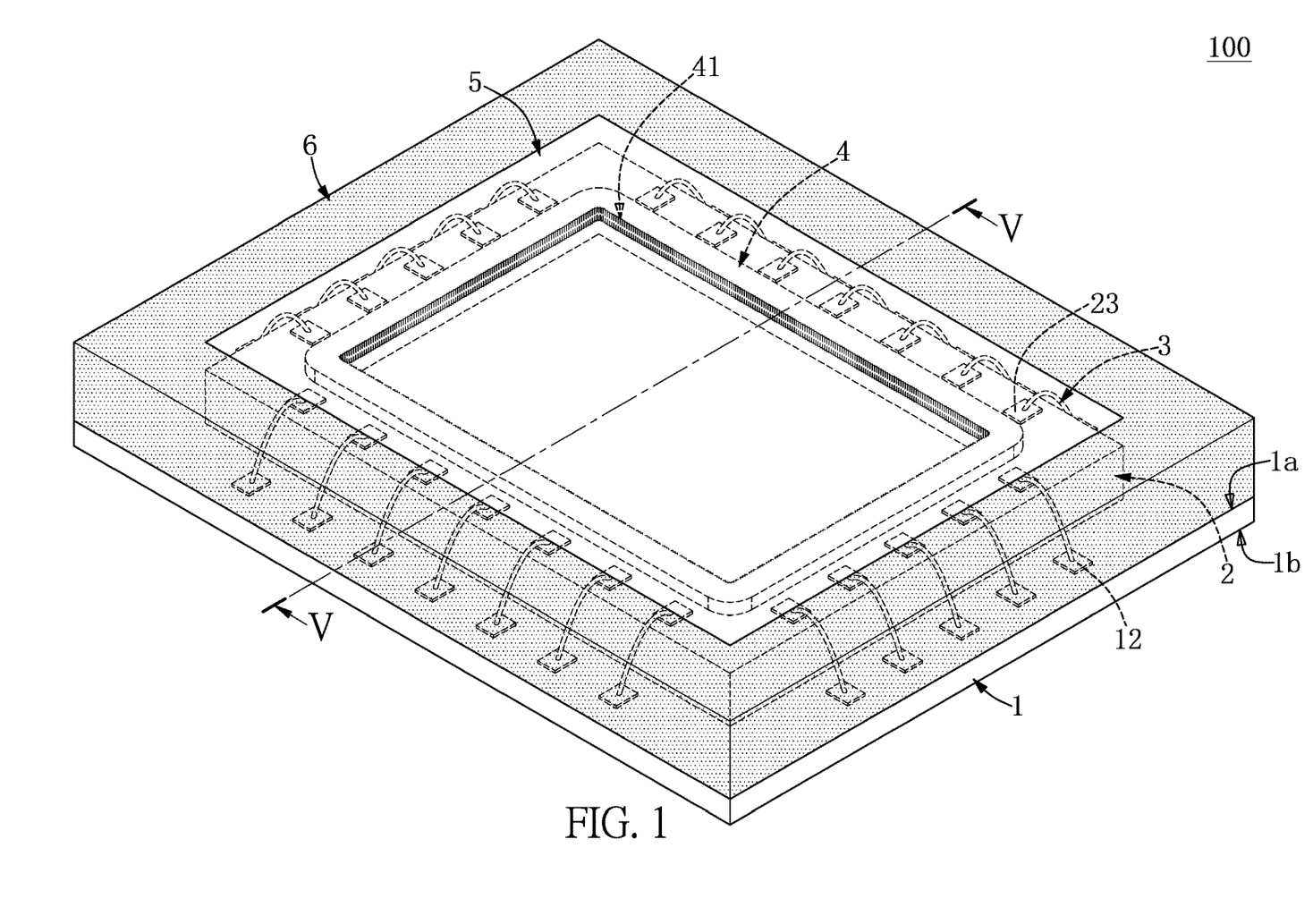
FIG. 1 is a perspective view of a sensor package structure according to a first embodiment of the present disclosure.
Figure 2:
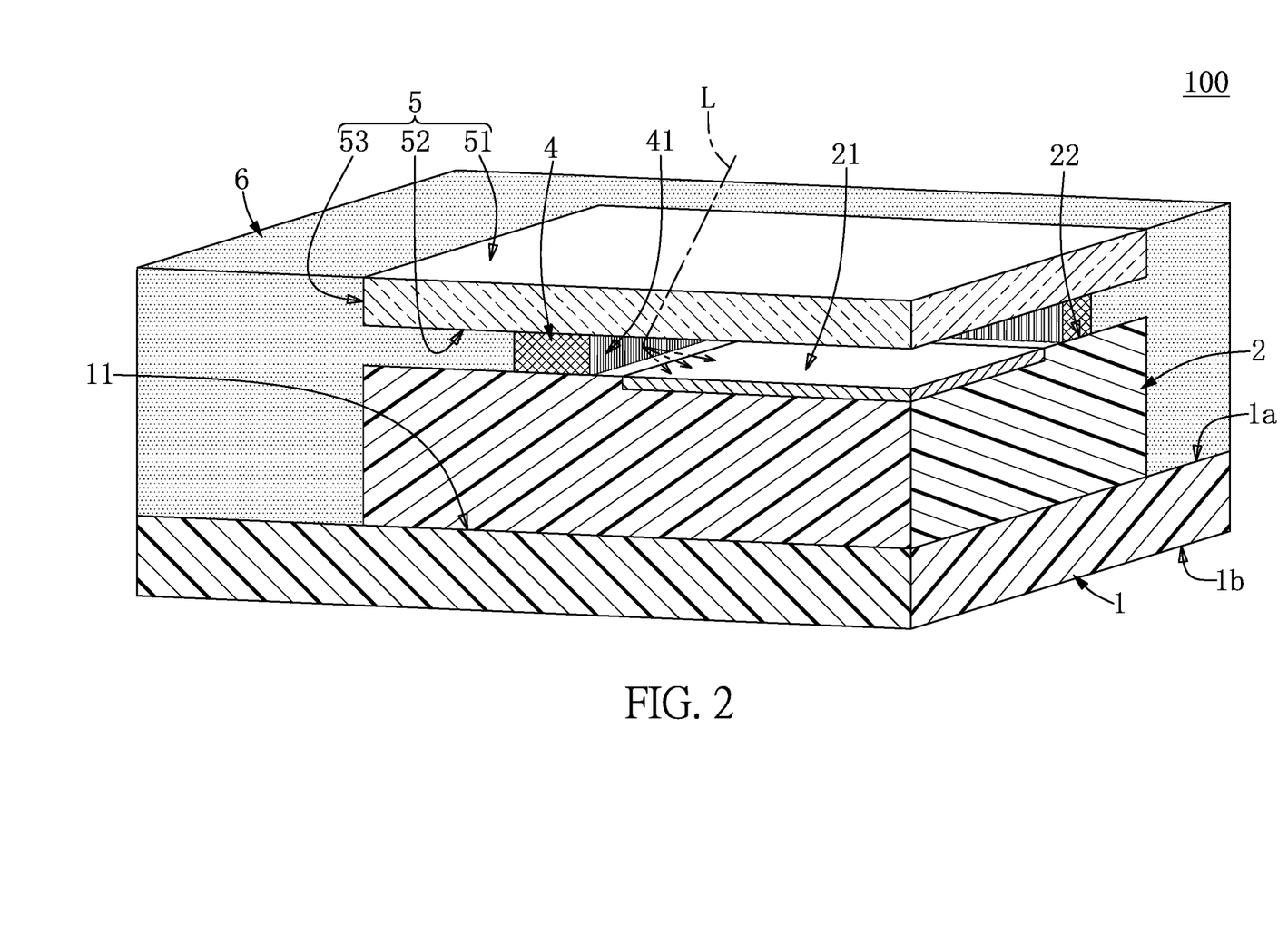
FIG. 2 is a cross-sectional view showing the sensor package structure of FIG. 1.

Referring to FIG. 1 to FIG. 5, an embodiment of the present disclosure provides a sensor package structure 100. As shown in FIG. 1 and FIG. 2, the sensor package structure 100 in the present embodiment includes a substrate 1, a sensor chip 2 disposed on the substrate 1, a plurality of metal wires 3 electrically connected to the substrate 1 and the sensor chip 2, an opaque support 4 disposed on the sensor chip 2, a light permeable layer 5 arranged above the sensor chip 2 through the opaque support 4, and a package body 6 that is formed on the substrate 1.

Although the sensor package structure 100 in the present embodiment is illustrated based on including the above components, but the sensor package structure 100 can be modified according to design requirements. For example, in other embodiments not shown in the present disclosure, the sensor package structure 100 can be provided without the metal wires 3, and the sensor chip 2 is fixed onto the substrate 1 through solder balls and via holes which electrically coupling the sensor chip 2 to the substrate 1.

Figure 3:
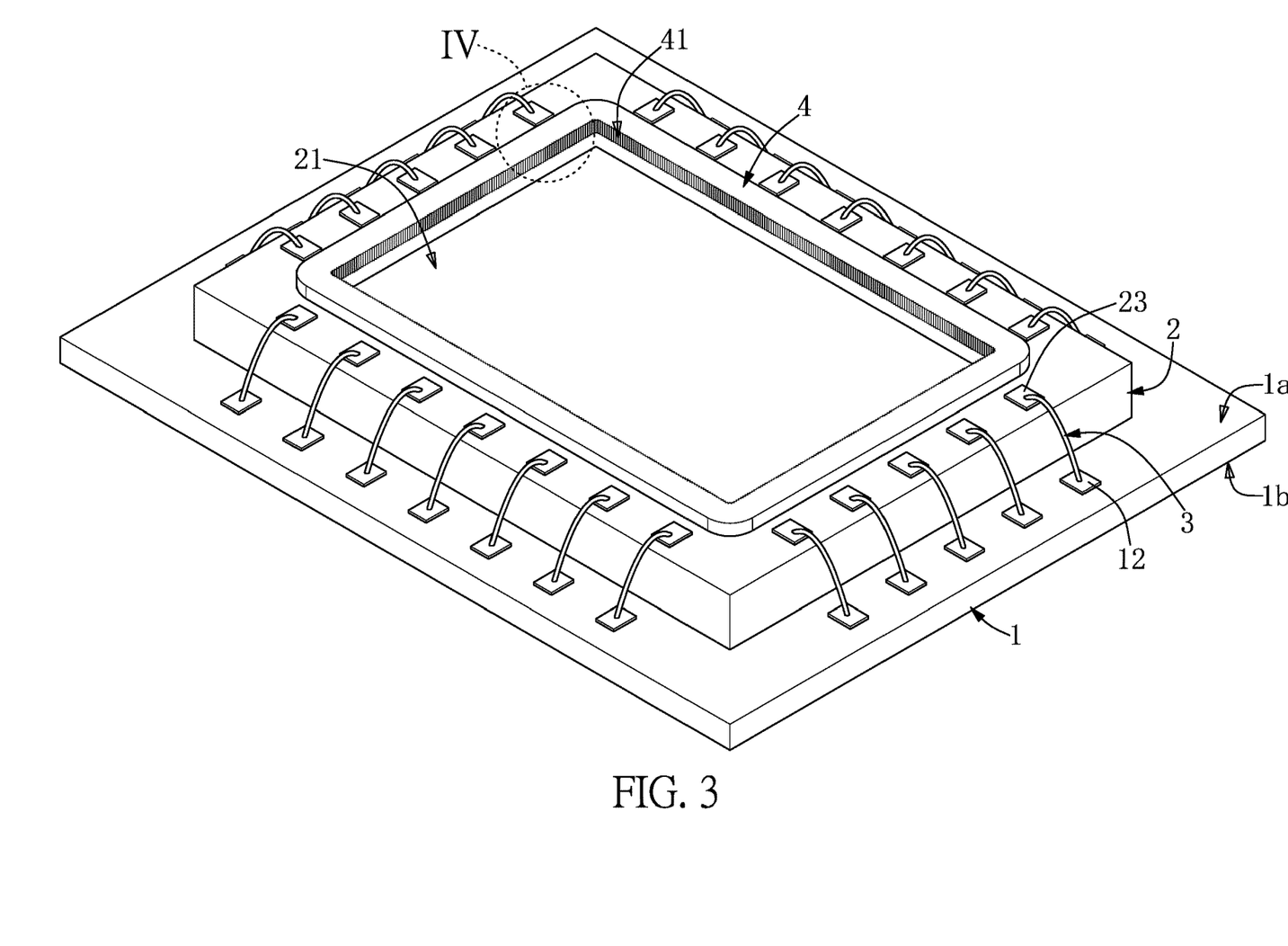
FIG. 3 is a perspective view showing a portion of the sensor package structure of FIG. 1 when a light permeable layer and a package body are omitted.
Figure 4:
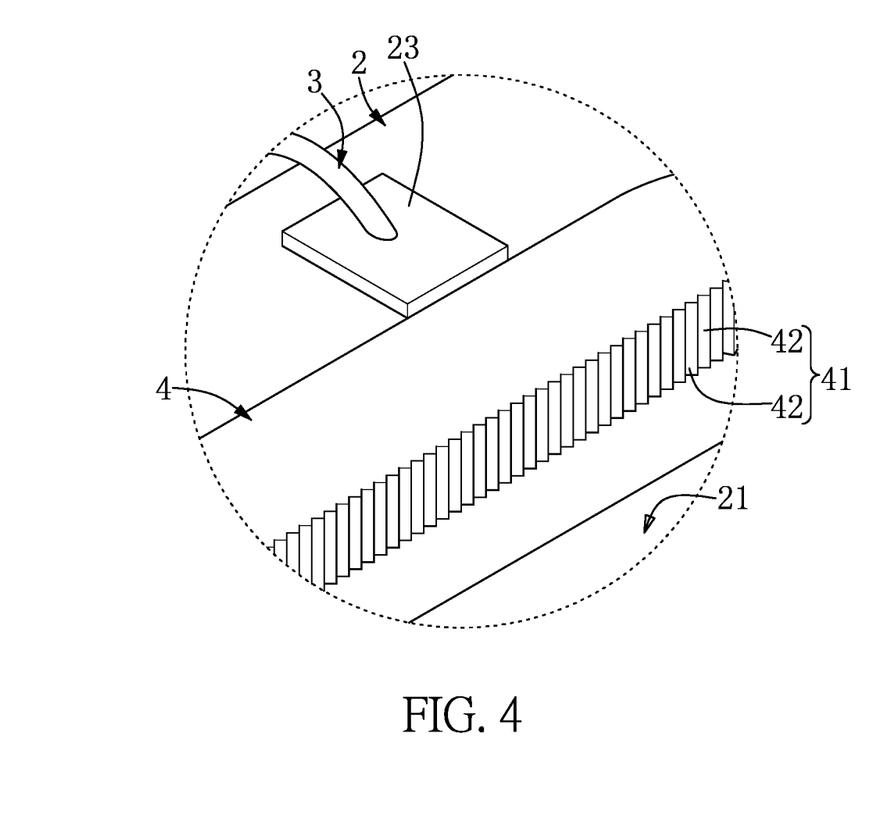
FIG. 4 is an enlarged view of portion IV of FIG. 3.
Figure 5:
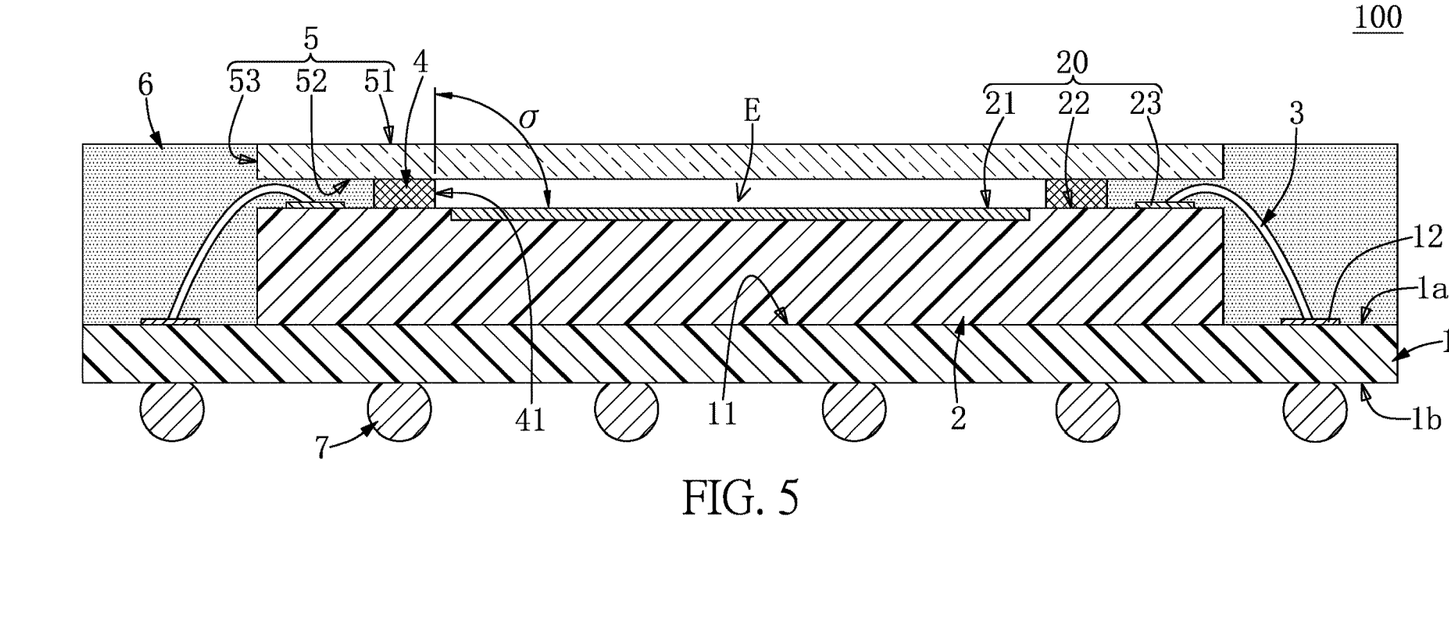
FIG. 5 is a cross-sectional view taken along line V-V of FIG. 1.

As shown in FIG. 3 to FIG. 5, the substrate 1 in the present embodiment is a printed circuit board (PCB) having a square shape or a rectangular shape, but the present disclosure is not limited thereto. The substrate 1 has a first board surface 1a and a second board surface 1b that is opposite to the first board surface 1a. The substrate 1 has a chip bonding region 11 and a plurality of first solder pads 12, the chip bonding region 11 is substantially on a center portion of the first board surface 1a, and the first solder pads 12 are arranged on the first board surface 1a and outside of the chip bonding region 11 (or the sensor chip 2). The first solder pads 12 in the present embodiment are substantially arranged in a ring shape, but the present disclosure is not limited thereto. For example, in other embodiments not shown in the present disclosure, the first solder pads 12 can be arranged in two rows that are respectively located at two opposite sides of the chip bonding region 11.

In addition, the substrate 1 in the present embodiment can be provided with a plurality of solder balls 7 disposed on the second board surface 1b, and the sensor package structure 100 can be mounted onto an electronic component (not shown) through the solder balls 7, thereby electrically coupling the sensor package structure 100 to the electronic component.

The sensor chip 2 in the present embodiment is illustrated as an image sensor chip, but the present disclosure is not limited thereto. The sensor chip 2 is fixed to the first board surface 1a of the substrate 1 (e.g., the chip bonding region 11), and the sensor chip 2 is located inboard of the first solder pads 12. Moreover, a top surface 20 of the sensor chip 2 has a sensing region 21, a carrying region 22 (in a ring shape) surrounding the sensing region 21, and a plurality of second solder pads 23 outside of the carrying region 22.

The quantity and positions of the second solder pads 23 of the sensor chip 2 in the present embodiment respectively correspond to those of the first solder pads 12 of the substrate 1. Moreover, terminals at one end of the metal wires 3 are respectively connected to the first solder pads 12, and terminals at the other end of the metal wires 3 are respectively connected to the second solder pads 23, so that the substrate 1 can be electrically coupled to the sensor chip 2 through the metal wires 3.

The opaque support 4 has a ring shape, and the opaque support 4 in the present embodiment is illustrated as a ring-shaped solder mask 4 (i.e., the opaque support 4 disclosed in the present embodiment can be replaced by the ring-shaped solder mask 4), but the present disclosure is not limited thereto. It should be noted that when the opaque support 4 is implemented with the ring-shaped solder mask 4, due to the factor that the ring-shaped solder mask 4 can be formed by punching manner, lithography, printing, or coating, the thickness of the ring-shaped solder mask 4 can be effectively and precisely controlled, and the shape of the ring-shaped solder mask 4 (e.g., the shape of the following light-scattering loop wall 41) can be precisely formed.

The opaque support 4 is disposed on the top surface 20 of the sensor chip 2 (e.g., the carrying region 22) and surrounds the sensing region 21. In other words, the opaque support 4 in the present embodiment is disposed outside of the sensing region 21 and inboard of the second solder pads 23, and the metal wires 3 are disposed outside of the opaque support 4 (i.e., the ring-shaped solder mask 4), but the present disclosure is not limited thereto. For example, in other embodiments not shown in the present disclosure, the opaque support 4 can be disposed on the carrying region 22, and the second solder pads 23 and a portion of each of the metal wires 3 are embedded in the opaque support 4.

Specifically, inner lateral sides of the opaque support 4 form a light-scattering loop wall 41. The light-scattering loop wall 41 has a plurality of ridges 42 arranged at equal intervals to form a zigzag structure. The ridges 42 of the zigzag structure of the light-scattering loop wall 41 are arranged at equal intervals along an annular direction, but the present disclosure is not limited thereto. For example, in other embodiments not shown in the present disclosure, the ridges 42 of the zigzag structure can be connected to each other or arranged at unequal intervals according to design requirements.

Moreover, an angle σ is formed between the light-scattering loop wall 41 and the plane of the sensing region 21, and the angle σ in the present embodiment is 90 degrees, but the present disclosure is not limited thereto. For example, the angle σ can be within a range of 80-100 degrees according to design requirements. Specifically, a longitudinal direction of each of the ridges 42 of the zigzag structure in the light-scattering loop wall 41 is preferably perpendicular to the top surface 20 of the sensor chip 2.

The light permeable layer 5 in the present embodiment is illustrated as a flat and transparent glass board, but the present disclosure is not limited thereto. The light permeable layer 5 is disposed on the opaque support 4. In other words, the opaque support 4 is sandwiched between the light permeable layer 5 and the sensor chip 2. Specifically, the light permeable layer 5 includes a first surface 51, a second surface 52 opposite to the first surface 51, and an outer lateral surface 53 that is connected to the first surface 51 and the second surface 52. The second surface 52 of the light permeable layer 5 is disposed on the opaque support 4. The second surface 52 of the light permeable layer 5, the light-scattering loop wall 41 of the opaque support 4, and the sensor chip 2 jointly define an enclosed space E. The sensing region 21 is arranged in the enclosed space E and faces toward the light permeable layer 5.

The package body 6 is disposed on the first board surface 1a of the substrate 1, and surrounds lateral outer sides of the sensor chip 2, outer lateral sides of the opaque support 4, and the outer lateral surface 53 and a portion of the second surface 52 of the light permeable layer 5. The first surface 51 of the light permeable layer 5 is exposed from the package body 6. Moreover, the first solder pads 12, the second solder pads 23, and the metal wires 3 are embedded entirely in the package body 6, but the present disclosure is not limited thereto.

Specifically, the package body 6 in the present embodiment is formed by solidifying a liquid compound, but the present disclosure is not limited thereto. For example, in other embodiments not shown in the present disclosure, a top portion of the package body 6 can be replaced by a molding compound; or, the package body 6 can be a molding compound.

The sensor package structure 100 of the present embodiment is disclosed in the above description. As shown in FIG.

2, when light L passes through the light permeable layer 5 and then impinges onto the light-scattering loop wall 41 at an incident angle, the light-scattering loop wall 41 (or the ridges 42 of the zigzag structure) can scatter the light L into multiple rays at angles different from the incident angle, thereby effectively reducing the occurrence of the glare phenomenon as to the sensor package structure 100.

In conclusion, in the sensor package structure of the present disclosure, the light-scattering loop wall is formed by inner lateral sides of the opaque support (or the ring-shaped solder mask), so that light (exiting from the light permeable layer) impinging onto the light-scattering loop wall can be scattered into a plurality of rays at angles different from the incident angle, and the glare phenomenon of the sensor package structure can be effectively reduced.

Specifically, when the opaque support of the present disclosure is implemented with the ring-shaped solder mask, since the ring-shaped solder mask can be formed by punching, lithography, printing, or coating, the thickness of the ring-shaped solder mask can be effectively and precisely controlled, and the shape of the ring-shaped solder mask (e.g., the shape of the light-scattering loop wall) can be precisely formed. Accordingly, the occurrence of the glare phenomenon as to the sensor package structure in the present disclosure can be further reduced.

Moreover, the light-scattering loop wall of the opaque support (or the ring-shaped solder mask) of the sensor package structure in the present disclosure can be formed with a specific structure (e.g., the light-scattering loop wall intersects with the plane of the sensing region at an angle that is within a range of 80-100 degrees; the longitudinal direction of each ridge of the zigzag structure of the light-scattering loop wall is perpendicular to the top surface of the sensor chip; or the ridges of the zigzag structure of the light-scattering loop wall are arranged at equal intervals), the glare phenomenon of the sensor package structure can be even further reduced accordingly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
    a substrate having a first board surface and a second board surface that is opposite to the first board surface;
    a sensor chip disposed on the first board surface of the substrate and electrically coupled to the substrate, wherein a top surface of the sensor chip has a sensing region;
    a ring-shaped solder mask disposed on the top surface of the sensor chip and surrounding the sensing region, wherein inner lateral sides of the ring-shaped solder mask form a light-scattering loop wall; and
    a light permeable layer having a first surface and a second surface that is opposite to the first surface and that is disposed on the ring-shaped solder mask, wherein the sensor chip, the second surface of the light permeable layer, and the light-scattering loop wall of the ring-shaped solder mask jointly define an enclosed space,
    wherein when light passes through the light permeable layer and then impinges onto the light-scattering loop wall at an incident angle, the light-scattering loop wall scatters the light into multiple rays at angles different from the incident angle;
    wherein the light-scattering loop wall has a plurality of ridges arranged to form a zigzag structure, and a longitudinal direction of each of the ridges of the zigzag structure is perpendicular to the top surface of the sensor chip.

2. The sensor package structure according to claim 1, wherein an angle between the light-scattering loop wall and the plane of the sensing region is within a range of 80-100 degrees.

3. The sensor package structure according to claim 1, wherein the ridges of the zigzag structure of the light-scattering loop wall are arranged at equal intervals.

4. The sensor package structure according to claim 1, further comprising a plurality of metal wires, wherein the substrate and the sensor chip are electrically coupled to each other through the metal wires.

5. The sensor package structure according to claim 4, further comprising a package body formed on the first board surface of the substrate, wherein the metal wires are arranged outside of the ring-shaped solder mask and are embedded entirely in the package body.

6. The sensor package structure according to claim 5, wherein the package body surrounds and is connected to outer lateral sides of the sensor chip, outer lateral sides of the ring-shaped solder mask, and an outer lateral surface and a part of the second surface of the light permeable layer, and wherein the first surface of the light permeable layer is exposed from the package body.

7. A sensor package structure, comprising:
    a substrate having a first board surface and a second board surface that is opposite to the first board surface;
    a sensor chip disposed on the first board surface of the substrate and electrically coupled to the substrate, wherein a top surface of the sensor chip has a sensing region;
    an opaque support disposed on the top surface of the sensor chip and surrounding the sensing region, wherein inner lateral sides of the opaque support form a light-scattering loop wall; and
    a light permeable layer having a first surface and a second surface that is opposite to the first surface and that is disposed on the opaque support, wherein the sensor chip, the second surface of the light permeable layer, and the light-scattering loop wall of the opaque support jointly define an enclosed space,
    wherein when light passes through the light permeable layer and then impinges onto the light-scattering loop wall at an incident angle by passing through the light permeable layer, the light-scattering loop wall scatters the light into multiple rays at angles different from the incident angle;
    wherein the light-scattering loop wall has a plurality of ridges arranged at equal intervals to form a zigzag structure, and a longitudinal direction of each of the ridges of the zigzag structure is perpendicular to the top surface of the sensor chip.

8. The sensor package structure according to claim 7, wherein an angle between the light-scattering loop wall and the plane of the sensing region is within a range of 80-100 degrees.

9. A sensor package structure, comprising:
a substrate having a first board surface and a second board surface that is opposite to the first board surface;
a sensor chip disposed on the first board surface of the substrate and electrically coupled to the substrate, wherein a top surface of the sensor chip has a sensing region;
a ring-shaped solder mask disposed on the top surface of the sensor chip and surrounding the sensing region, wherein inner lateral sides of the ring-shaped solder mask form a light-scattering loop wall; and
a light permeable layer having a first surface and a second surface that is opposite to the first surface and that is disposed on the ring-shaped solder mask, wherein the sensor chip, the second surface of the light permeable layer, and the light-scattering loop wall of the ring-shaped solder mask jointly define an enclosed space; and
a package body formed on the first board surface of the substrate;
wherein when light passes through the light permeable layer and then impinges onto the light-scattering loop wall at an incident angle, the light-scattering loop wall scatters the light into multiple rays at angles different from the incident angle;
wherein the light-scattering loop wall has a plurality of ridges arranged to form a zigzag structure, and a longitudinal direction of each of the ridges of the zigzag structure is perpendicular to the top surface of the sensor chip.

* * * * *